(12) United States Patent
Unnikrishnan et al.

(10) Patent No.: US 6,810,372 B1
(45) Date of Patent: Oct. 26, 2004

(54) MULTIMODAL OPTIMIZATION TECHNIQUE IN TEST GENERATION

(75) Inventors: Manoj Unnikrishnan, Santa Clara, CA (US); Gurushankar Rajamani, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/456,953

(22) Filed: Dec. 7, 1999

(51) Int. Cl.$^7$ .......................... G06F 17/50; G01R 31/28
(52) U.S. Cl. ............................ 703/13; 703/14; 703/15; 714/738; 716/4
(58) Field of Search ................... 703/13–15; 714/738; 716/4

(56) References Cited

U.S. PATENT DOCUMENTS 5,651,099 A     7/1997  Konsella
5,983,381 A  * 11/1999  Chakradhar et al. ........ 714/738

OTHER PUBLICATIONS

Morris ed.—Academic press dictionary of science and technmology; Academic Press; p. 1748; 1992.*
Deng et al.; "on improving random number generators"; IEEE Proc. Winter Sim. Conf.; pp. 1035–1042; 1991.*
Shen, "Genetic algorithm based test generation for sequential circuits"; IEEE Test Symp. Proc.; pp. 179–184; Nov. 18, 1999.*
Cruz; "PLAGA: a highly parallelizable genetic algorithm for programmable logic arrays test pattern generation"; IEEE Proc. CEC; pp. 944–951; Jul. 9, 1999.*
Dougherty et al.; "Using regression anlysis for GA–based ATPG parameter generation"; IEEE ICCD '98; pp. 516–521; Oct. 1998.*
Cruz; "PLAGA: a novel artificial life test pattern generation for VLSI circuits"; IEEE Symp. Ckts & Sys; pp. 337–340; Aug. 11, 1999.*
Arslan et al.; "A gen etic algorithm for multiple fault model test generation for combinational VLSI circuits"; IEEE GALESIA 97; pp. 462–466; Sep. 1997.*
Rudnick et al.; "Simulation–based techniques for dynamic test sequence compaction"; IEEE ICCAD–96; pp. 67–73; Nov. 14, 1996.*

* cited by examiner

*Primary Examiner*—Hugh Jones

(57) ABSTRACT

A method of and system for generating tests and using the tests to identify VLSI simulation and circuit operation faults and errors and validate performance uses a genetic algorithm. Each generation of tests is further processed to eliminate redundant tests and make room for the insertion of new genetic material into the population in the form of random test vectors. The resulting family of tests generated using a simulation of the VLSI can then be ported to the circuit once prototyped in silicon and adapted to the new environment using, once again, the genetic algorithm to suitably evolve the test population.

12 Claims, 3 Drawing Sheets

MULTIMODAL OPTIMIZATION TECHNIQUE IN TEST GENERATION

TECHNICAL FIELD

The present invention generally relates to very large scale (VLSI) testing and more particularly to the use of a genetic algorithm to generate families of test vectors to validate simulated and silicon-based VLSI performance.

BACKGROUND OF THE INVENTION

Various approaches have been taken to the design and testing of very large scale integrated (VLSI) circuits. Because of the costs of design and testing, various tools have been developed to support circuit design, evaluation, and testing. Since the mid-1970s, digital designers have utilized hardware description languages (HDLs), the most prominent of which are Verilog and the IEEE standard VHDL. While Verilog is a C-like language, VHDL provides similar functionality in an Ada-like environment. These tools allow the designer to describe circuits at a very high level of abstraction as well as at gate and switch levels to design VLSI integrated circuits, provide layouts and support chip fabrication. Thus, a primary use of HDLs is to simulate designs before the design is committed to silicon. After a design is proved through simulation, and committed to silicon prototyping, the prototype device is then subjected to additional testing to verify operation and compliance with the specifications.

At both the simulation stage prior to IC fabrication and after the design has been fabricated in the form of a VLSI, testing is carried out using tests of predetermined test vectors which exercise and drive either the simulated or the actual fabricated VLSI to verify operation and identify faults, i.e., "bugs."

Typically, test design starts with the generation of random test vectors which may be optimized to cause the circuitry under test to enter particular states. The tests may be designed to provide three types of coverage: block, where an encapsulated piece of simulation code is exercised; expression coverage, which verifies evaluation of particular expressions; and path coverage, which uses a state machine paradigm to ensure proper operation of the state machine. Ultimately, the test vectors should provide for maximal coverage so as to identify all faults in either the simulation or the prototype.

Because of the extreme resources required to fully test complex circuitry, it is not feasible to fully exercise all paths and ensure that there are no holes in either the simulation or the test. Instead, tests are evaluated to determine if they hit interesting corner cases or other conditions which are more likely to identify faults or limitations of the design (e.g., register overflow, excess wait cycles, etc.). Collections of such tests and their component test vectors may be maintained as a library, particularly if such tests have previously been found to identify bugs in the design.

The generalized method of testing a VLSI device such as an ASIC (application-specific integrated circuit) is shown in FIG. 1 including Functional Simulation and Silicon Testing processes. Tests are for use in both the simulations framework and actual silicon test framework. In the simulation framework, these tests are normally defined at the transaction level, the tests being specified by means of test profiles which include knobs (or parameters.) Thus, for example, in a processor bus there are several parameters for a transaction on the bus such as transaction type, transaction length, number of snoop stalls for the transaction, response delay, response type, etc. In contrast, tests in the actual silicon framework are defined in terms of bit vectors. The bit vectors are typically extracted from the simulation framework itself. Chip pin observer code in the simulations framework captures these bit vectors which are then fed into actual silicon in the chip testers.

At entry point 10, specified interesting events are defined. These interesting events include (a) software counters embedded in the simulation framework that indicate corner cases likely to get the ASIC to interesting states (e.g., queue filled, hard to reach states in state machines, interesting bus conditions, etc.), and (b) hardware counters built into a chip that flag corresponding interesting chip states. Test Profile data is provided at an initial step 20 and used to control the operation of a Test Generator 30 and the application of tests from library 40. Tests from Test Generator 30 are used by Simulator 50 to exercise the HDL representation of the ASIC. The results of this testing are then used at step 60 to determine the quality of the test which is in turn used to redefine the tests maintained in library 40. Library 40 is then used to exercise Actual Silicon at step 70 so as to identify an faults introduced during ASIC fabrication.

A problem with this methodology is that it is often difficult to design a minimal set of test vectors which provide maximum coverage of such interesting events and conditions. This is particularly true when tests developed and used to evaluate the simulation may be deficient in identifying faults introduced during or because of conditions unique to the fabrication process and because it is necessary to reengineer the tests to accommodate the VLSI once committed to and produced in silicon. That is, present methods are unable to identify and define a minimum set of tests using the simulation framework which ensure high functional coverage of the chip and would likely identify any faults introduced during fabrication during actual silicon testing.

Accordingly, an object of the invention is to provide a method and system for generating tests and test vectors to validate simulated and silicon-based VLSI performance and operation, identify errors and faults in logic, layout, circuit spectrum, fabrication and otherwise. Another object of the invention is to provide a dynamic test generation method and system which heuristically adapts to particular test environments and conditions and translates from simulation, to prototyping, to production-stage quality control applications.

SUMMARY OF THE INVENTION

These and other objects, features and technical advantages are achieved by a method of and system which uses a genetic algorithm to breed a population of tests from an initial set of random test vectors to maximize coverage and confirm circuit operation. The resultant tests subject the VLSI to extreme conditions by observing "interesting events" likely to produce or require recovery from fault conditions. The resulting tests are then sorted according to the conditions or events included in or exercised by the test. The list is then reviewed in order of increasing number of events covered by individual tests with the elimination of tests covering events or conditions already covered by tests later in the ordered list. Thus, the minimal set of tests spanning particular events or interesting conditions is obtained.

A method according to the invention tests an integrated circuit (simulated or in silicon) by providing a population of tests. Types and numbers of events are examined and identified for each of the tests. The tests are then sorted in order of the number of events examined to provide a sorted list of the tests. The sorted list of tests is examined and those tests having events which are duplicated by other tests are eliminated. The remaining population of tests are then bred using a genetic algorithm and possibly including new randomly generated tests to form a new generation of tests constituting a new population. The process of categorizing tests to identify number and types of events evaluated by each of the tests, sorting and pruning to eliminate redundant tests, and using a genetic algorithm to converge the tests results in an optimized population having a predetermined criteria (e.g., maximal spanning).

According to a feature of the invention, each of the tests comprises at least one test vector defining a state condition of the integrated circuit. The integrated circuit in this case may be either a simulation or a physical integrated circuit.

According to another aspect of the invention, the step of breeding includes running each of the tests to evaluate fitnesses thereof, selecting breeders from among the tests based on the fitnesses, selecting a crossover point for each of the breeders to define first and second portions thereof, and, for each of the breeders, splicing the first portion to the second portion of another one of the breeders to form a new generation of the tests. A mutation step may be included for generating a pseudorandom marker and altering a corresponding portion of at least one of the new generation of tests at the marker. The mutation step may be performed a number of times in reverse relationship to the number of a corresponding one of the generations whereby mutations are performed less frequently in each subsequent generation so as to enhance convergence. Alternatively, mutation may be responsive to a fitness evaluation of the breeder (as a measure of convergence) so that mutation occurs less frequently as fitness of the tests increases.

According to another aspect of the invention, the method further includes evaluating a model of an integrated circuit using a final generation of the tests, fabricating a prototype integrated circuit based on the model, and evaluating the prototype integrated circuit using a final generation of the tests.

According to another aspect of the invention, a method of designing an integrated circuit includes the steps of simulating an operation of the integrated circuit, generating test vectors which converge on points in invocation space more likely to produce predetermined types of states using an order-based genetic method applied to the simulation of the integrated circuit, testing the simulation of the integrated circuit using test vectors, fabricating a prototype of the integrated circuit based on the simulation and test results obtained, and testing the prototype using the test vectors.

According to another aspect of the invention, a system for designing an integrated circuit includes a database storing a population of tests, each of the tests including at least one test vector. A simulator emulates an operation of the integrated circuit and identifies types and numbers of events examined by each of the tests. A processor is operative to sort the tests in order of the number of tests examined to provide a sorted list of the tests. The processor examines the sorted list of tests and eliminates ones of the tests from the population having types of events examined that have also been or will be examined by others of the tests. The resulting population of tests is then bred to form a next generation of tests constituting a new population until a predetermined criteria is achieved. The processor may further run each of the tests to evaluate a fitness thereof. Breeders are then selected from among the tests based on fitness, and crossover points are selected for each of the breeders to define first and second portions thereof The processor is further operative to splice a first portion of each of the breeders with a second portion of other breeders to form a second generation of tests. The crossover points may be identified by generating a pseudorandom marker.

According to another aspect of the invention, a system for exercising an integrated circuit includes a database storing a family of randomly generated initial test vectors. An order-based genetic algorithm acts on the initial test vectors to generate a new generation of test vectors which converge on points, in invocation space more likely to produce predetermined types of states. An optimization routine is used for sorting the test vectors and eliminating from the new generation of test vectors those test vectors redundantly producing particular types of states. A circuit simulator executes the test vectors and provides an output to the order-based genetic algorithm for use in generating the new generation of test vectors.

According to another aspect of the invention, a computer program having a computer readable medium with a computer program logic recorded thereon for implementing testing of an integrated circuit includes a database storing a population including a plurality of tests. A test evaluation routine identifies types and numbers of events examined by each of the tests. A sort routine sorts the tests in order of the number of events examined so as to provide a sorted list of tests. A redundant test elimination routine examines the sorted list of tests and eliminates those tests from the population which are limited to examining events which are also examined by others of the tests. A genetic algorithm is used to breed the population to form a next generation of tests constituting a new population with a control routine causing a repeated execution of the evaluation, sort, redundant test elimination and genetic algorithm routines to form successive generations of the populations until a predetermined criteria is achieved.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
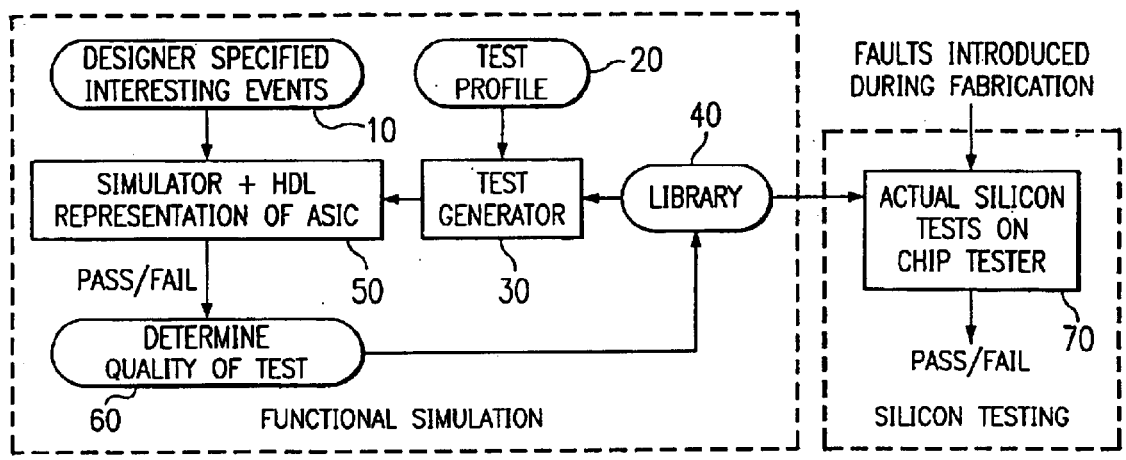
FIG. 1 depicts a diagram of a test generation and implementation procedure.
Figure 2:
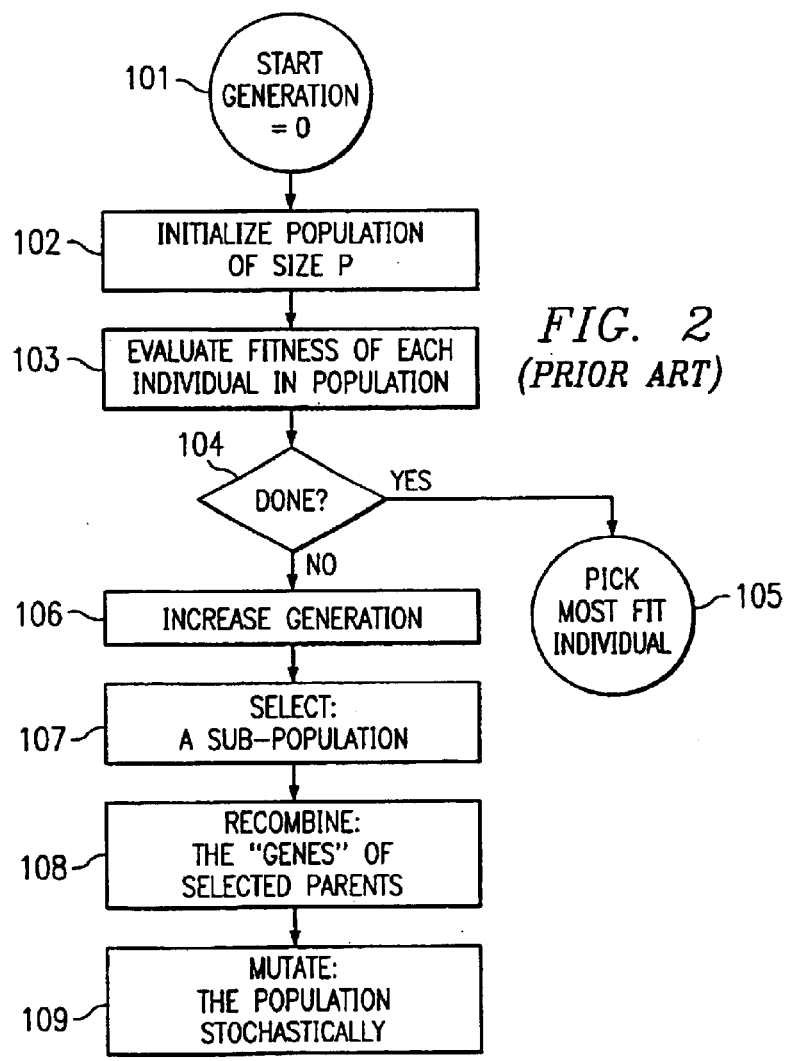
FIG. 2 depicts a flow diagram of a genetic algorithm applicable to the invention.

The test generation methodology used and embodied by the invention includes the generation of an initial family of tests, manipulation of members of the family using a genetic algorithm to breed and mutate the population of tests to heuristically develop a maximal testing capability, and a pruning process to eliminate overlapping coverage and provide for its replacement by new tests and test vectors thereby expanding the span of coverage of the family. The population includes the set of test vectors having maximum VLSI functional coverage. The use of genetic algorithms to optimize computer programs and operations is described, for example, in Konsell, U.S. Pat. No. 5,651,099, commonly assigned with the instant invention and incorporated herein by reference. Referring to FIG. 2, a simplified flow chart of a general genetic algorithm used according to a preferred embodiment of the invention is shown. Prior to starting a genetic algorithm, an initial population size (P) and number of generations must be selected. In general, as the population size (P) increases, the convergence of the genetic algorithm occurs with fewer generations. However, the increased population size has an adverse effect on the single generation execution time of the genetic algorithm.

Given the population size of P, the genetic algorithm first initializes the population to a generally random sampling 102. In the present case the starting population comprises tests of randomly generated test vectors. Next, at step 103, the fitness of each individual in the population (P) is evaluated. This fitness factor indicates the quality of the members of the population, i.e., the number of events covered by each test. Thus, the greater the number of events covered by a test, the better the fitness factor of the test. Determination of the fitness factor may be accomplished by running the tests on a simulation or an actual IC device. In the case of the simulation, Verilog HDL may be used to simulate the operation of an IC. Another system available for testing and verification of the test vectors would include the Hewlett-Packard HP83000 F660 series high performance VLSI test systems. From such evaluation, critical and interesting events and conditions may be identified for each of the test vectors and/or tests. At decision step 104 a check is made to determine if the number of generations executed equals the maximum number of generations as originally selected, i.e., five to ten cycles of breeding of the population, and, if so, at step 105 the most fit set of tests are selected. In the alternative, the next generation is created at step 106. In creating the next generation, a subpopulation is first selected at step 107, which then undergoes the genetic alterations including crossover, mutation, and introduction of new genetic material in the form of random test vectors replacing redundant or uninteresting tests. The crossover technique is a method of creating a child member from two chosen parent members. Various crossover techniques may be employed. Mutation, on the other hand, refers to a method of modifying the characteristics of a member of a populations so as to generate a possible improved member. In the present context, the mutation process varies the values of certain parameters or knobs within predetermined limits so as to create an improved test.

The selection process used in the preferred embodiment copies individuals from previous generations giving the most fit individuals the most copies and the least fit individuals the fewest or no copies. Genes of selected parents (i.e., test vectors) are recombined at step 108 by picking mating pairs and recombining their genes to form children through a simple crossover operation. A uniform crossover technique may be used, such that parameters are alternatively chosen from two randomly selected members. For example, the parent members may be defined as follows:

| Member I | Member II |
|---|---|
| Parameter A val = a1 | Parameter A val = a2 |
| Parameter B val = b1 | Parameter B val = b2 |
| Parameter C val = c1 | Parameter C val = c2 |
| . . . etc. | . . . etc. |

In this example, parent Members I and II have equal size sets of parameters created from the Test profiles, however the values of the parameters are different. Using a uniform crossover technique, the result of the crossover is as follows:

| Child | |
|---|---|
| Parameter A val = a1 | from Member I |
| Parameter B val = b2 | from Member II |
| Parameter C val = c1 | from Member I |
| . . . etc. | . . . and so on, alternating. |

Portions of the population are stochastically mutated at step 109 with a low probability, which randomly mutates alleles (i.e., portions of test vectors) in the children. The new population is then evaluated for fitness of each individual at 103 and the iterative process of the genetic algorithm continues. Each new generation goes through the selection, recombination, and mutation processes until the desired number of generations have been evaluated. After the last generation, the most fit individual in the form of an optimal spanning test or set of tests is selected at 105.

Figure 3:
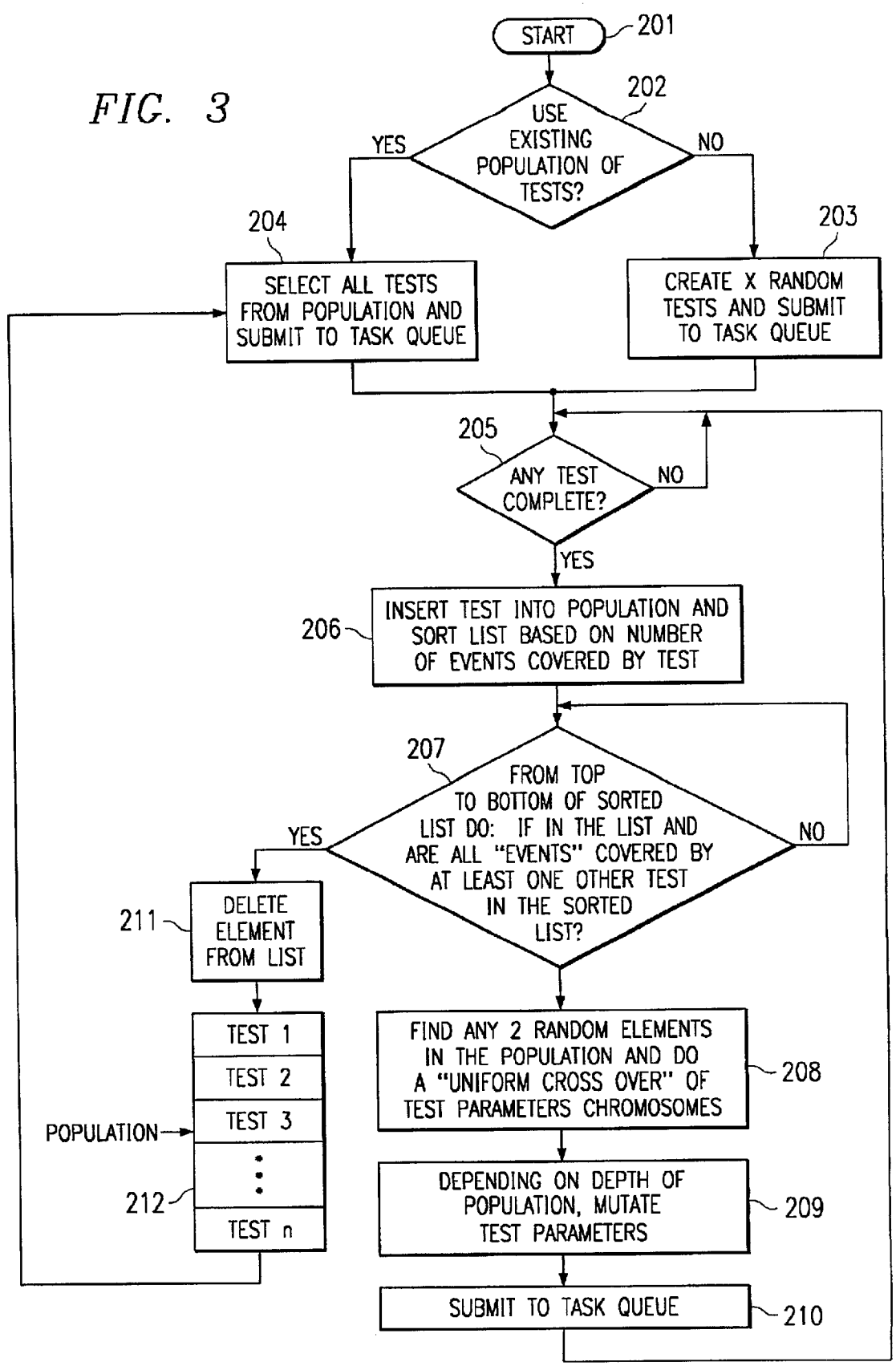
FIG. 3 depicts a flow diagram of a test generation method according to the invention.

Referring now to FIG. 3, a specific implementation of a genetic algorithm for practicing the present invention is described. Initially, processing is started at step 201 and, at step 202, a decision is made whether an existing database of tests exists and can be used as seed material to initiate the genetic algorithm. If not, then an appropriate number of random test vectors (e.g., ten) are generated at step 203 and submitted to a task queue for evaluation. Alternatively, if a suitable population of tests is available, then those tests are submitted to the test queue at step 204. These tests may be the result of prior testing, prestored library of tests, or tests produced by immediately previous processing of the genetic algorithm. A wait loop is entered at step 205 to receive the results of any of the tests back from the test queue.

Upon test completion, the test is inserted into the population at step 206 and a sorted list is produced based on the number of events covered by the test. At step 207, the list is scanned to eliminate tests which duplicate events covered by tests further up the sorted list, i.e., tests on equal or greater number of events than the test under consideration at step 207. The purpose of sorting step 207 is to create a population of tests which cover a maximum number of interesting cases (events) with the least number of tests in the population. This corresponds to minimizing the time required to test real silicon on a chip tester so as to validate VLSI functionality. Thus, when a test is run and the set of events covered by the test is obtained, sorting is used to determine if the test should be added to the population. This is done by maintaining a list of all of the test in the current population along with the events covered by each test. The list is maintained in sorted order so that when a new test is to be validated, it is inserted into the list in accordance with the number of events covered by it. Following insertion into the sorted list, the list is traversed in order from least to greatest number of events covered. For each test member in the list, a check is performed to determine if any other element in the list cover each event covered by the test member under consideration. If all events are duplicated by other test members higher up the list, then the test member under consideration may be eliminated. The elimination process may be implemented as follows:

```
/* Sort process */
For Each Element i in the list (population) DO
    UNIQUE=0;
    For Each Event j covered by this Element i
    {
        if (Event j) is covered by any other element not equal to i
        else UNIQUE=1; break;
    }
    /* After all the events are checked */
    if (UNIQUE==0) Delete Element i from the list.
```

Thus, duplicative tests are eliminated and deleted from the list at step 211 to form a new population at step 212. Alternatively, if all tests provide non-overlapping coverage so that no may be eliminated without reducing coverage, then processing continues at step 208. Therein, any two random elements in the population are found and a uniform crossover of test parameter chromosomes (i.e., test vectors) is performed to generate two new children tests. Depending on the depth of the population, a mutation step is performed at 209. Preferably, mutations occur with less frequency as the number of generations increases. For example, with a maximum generation of 10, mutations will be common in the formulation of generations 1 through 3, less common in generations 4 through 7, and rare in generations 8, 9 and 10, progressively. Finally, the resultant tests are submitted to the task queue and processing continues back at decision step 205 near the top of FIG. 3.

The use of a genetic algorithm to optimize test sets provides several advantages when the depth of population is limited to a predetermined number of generations. For example, it has been found that a preferred number of generations would fall in a range of 5 to 15, with an optimal maximum of 10 generations found to (i) maximize convergence while (ii) maintaining sufficient randomness to avoid premature convergence on local minima so that global optimization is maximized. The process is further enhanced by decreasing mutation as the depth of population increases. Thus, a 100% mutation is used by providing random test vectors forming a first generation with decreasing mutation used as the depth of population increases on a generation-by-generation basis.

Incorporating selective pruning of tests to avoid duplicate event coverage further enhances test coverage by eliminating unnecessary tests and providing for incorporation and growth of new tests according to the genetic algorithm. This pruning is accomplished by, at each stage, sorting tests which provide overlapping coverage of events, and eliminating tests exhibiting exclusive overlapping coverage, i.e., duplicating events already covered by other tests.

Figure 4:
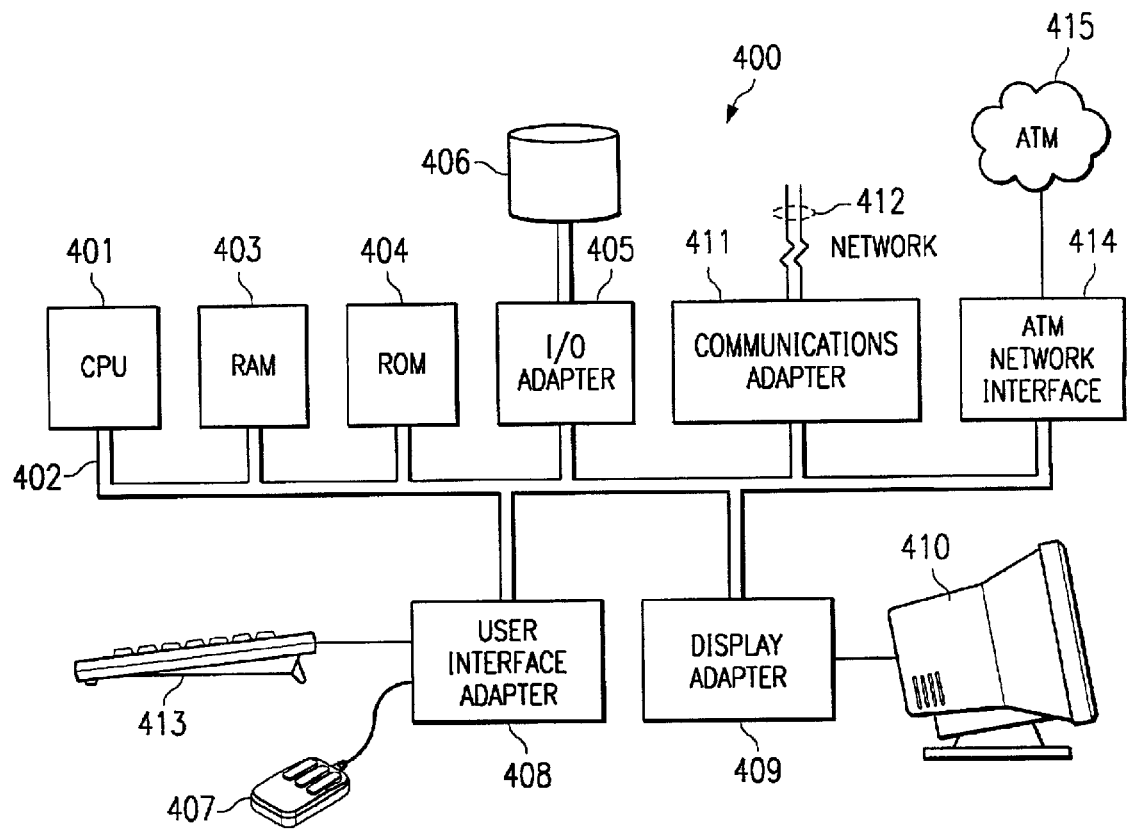
FIG. 4 depicts a block diagram of a computer system which is adapted to use the present invention.

FIG. 4 illustrates computer system 400 adapted to use the present invention. Central processing unit (CPU) 401 is coupled to system bus 402. The CPU 401 may be any general purpose CPU, such as an HP PA-8200 or Intel Pentium II processor. However, the present invention is not restricted by the architecture of CPU 401 as long as CPU 401 supports the inventive operations as described herein. Bus 402 is coupled to random access memory (RAM) 403, which may be SRAM, DRAM, or SDRAM. ROM 404 is also coupled to bus 402, which may be PROM, EPROM, or EEPROM. RAM 403 and ROM 404 hold user and system data and programs as is well known in the art.

The bus 402 is also coupled to input/output (I/O) controller card 405, communications adapter card 411, user interface card 408, and display card 409. The I/O card 405 connects to storage devices 406, such as one or more of hard drive, CD drive, floppy disk drive, tape drive, to the computer system. Communications card 411 is adapted to couple the computer system 400 to a network 412, which may be one or more of local (LAN), wide-area (WAN), Ethernet or Internet network. User interface card 408 couples user input devices, such as keyboard 413 and pointing device 407, to the computer system 400. The display card 409 is driven by CPU 401 to control the display on display device 410.

Although the present invention and its advantages have been described in detail, it should be understood that various changes, substitutions and alterations can be made herein without departing from the spirit and scope of the invention as defined by the appended claims.

What is claimed is:

1. A method of testing an integrated circuit comprising the steps of:

(a) providing a population including a plurality of tests;

(b) identifying types and numbers of events examined by each of said tests;

(c) sorting said tests in order of said number of events examined to provide a sorted list of said tests;

(d) examining said sorted list of said tests and eliminating ones of said tests from said population having types of said events examined that are also examined by others of said tests;

(e) breeding the population to form a next generation of said tests constituting a new population, wherein said breeding further comprises:

running each of said tests to evaluate a fitness thereof;

selecting breeders from among said tests based on said witnesses;

selecting a crossover point for each of said breeders to define first and second portions thereof; and for each of said breeders, splicing said first portion to said second portion of another one of said breeders to form a new generation of said tests;

(f) a mutation step of generating a pseudorandom marker and altering a corresponding portion of at least one of said new generation of tests at said pseudorandom marker; and (g) repeating steps (b) through (f) of said method to form successive generations of said populations until a predetermined criteria is achieved.

2. The method according to claim 1 wherein each of said tests comprises at least one test vector defining a state condition of said integrated circuit.

3. The method according to claim 1 wherein said step of identifying includes a step of simulating said integrated circuit.

4. The method according to claim 1 wherein said mutation step is performed a number of times in inverse relationship to a number of a corresponding one of said generations.

5. The method according to claim 1 wherein said mutation step is performed a number of times in inverse relationship to said fitnesses of ones of said breeders corresponding to respective ones of said new generation of tests.

6. The method according to claim 1 further comprising the steps of:

(h) evaluating a model of an integrated circuit using a final generation of said tests;

(i) fabricating a prototype integrated circuit based on said model; and (j) evaluating said prototype integrated circuit using said final generation of said tests.

7. A system for designing an integrated circuit comprising:

(a) a database storing a population of tests, each of said test including at least one test vector;

(b) a simulator emulating an operation of said integrated circuit and identifying types and numbers of events examined by each of said tests; and (c) a processor operative for (i) sorting said tests in order of said number of events examined to provide a sorted list of said tests, (ii) examining said sorted list of said tests and eliminating ones of said tests from said population having types of said events examined that are also examined by others of said tests, (iii) run each of said tests to evaluate a fitness thereof;

(iv) select breeders from among said tests based on said fitnesses;

(v) select a crossover point for each of said breeders to define first and second portions thereof;

(vi) breeding the population to form a next generation of said tests constituting a new population until a predetermined criteria is achieved;

(vii) for each of said breeders, splice said first portion to said second portion of another one of said breeders to form a new generation of said tests; and (viii) generating a pseudorandom marker and altering a corresponding portion of at least one of said new generation of tests at said pseudorandom marker.

8. A computer program product having a computer readable medium having computer program logic recorded thereon for implementing testing of an integrated circuit, comprising:

(a) code when implemented by a computer for storing a population including a plurality of tests in a database;

(b) code when implemented by a computer for evaluating a test to identify types and numbers of events examined by each of said tests;

(c) code when implemented by a computer for sorting said tests in order of said number of events examined to provide a sorted list of said tests;

(d) code when implemented by a computer for eliminating a redundant test by examining said sorted list of said tests and eliminating ones of said tests from said population having types of said events examined that are also examined by others of said tests;

(e) code when implemented by a computer for breeding the population with a genetic algorithm to form a next generation of said tests constituting a new population, wherein said genetic algorithm comprises the processes of:

running each of said tests to evaluate a fitness thereof;

selecting breeders from among said tests based on said fitnesses;

selecting a crossover point for each of said breeders to define first and second portions thereof; and for each of said breeders, splicing said first portion to said second portion of another one of said breeders to form a new generation of said tests;

(f) code when implemented by a computer for mutating said population by generating a pseudorandom marker and altering a corresponding portion of at least one of said new generation of tests at said pseudorandom marker; and (g) code when implemented by a computer for repeating operation of (b) through (f) to form successive generations of said populations until a predetermined criteria is achieved.

9. The computer program product according to claim 8 wherein each of said tests comprises at least one test vector defining a state condition of said integrated circuit.

10. The computer program product according to claim 8 wherein said code for evaluating includes code for simulating said integrated circuit.

11. The computer program product according to claim 8 wherein said code for mutating is performed a number of times in inverse relationship to a number of a corresponding one of said generations.

12. The computer program product according to claim 8 further comprising:

(h) code for when implemented by a computer evaluating a model of an integrated circuit using a final generation of said tests;

(i) code for when implemented by a computer fabricating a prototype integrated circuit based on said model; and (j) code for when implemented by a computer evaluating said prototype integrated circuit using said final generation of said test.

* * * * *

UNITED STATES PATENT AND TRADEMARK OFFICE
CERTIFICATE OF CORRECTION

PATENT NO.   : 6,810,372 B1                                             Page 1 of 1
DATED         : October 26, 2004
INVENTOR(S)  : Unnikrishnan et al.

It is certified that error appears in the above-identified patent and that said Letters Patent is hereby corrected as shown below:

<u>Column 8,</u>
Line 38, delete "witnesses;" and insert therefor -- fitnesses; --

Signed and Sealed this

Fourteenth Day of June, 2005

JON W. DUDAS
*Director of the United States Patent and Trademark Office*